United States Patent
Buffa et al.

(10) Patent No.: US 10,123,103 B1
(45) Date of Patent: Nov. 6, 2018

(54) SIGMA DELTA MODULATOR FOR SENSORS

(71) Applicant: Infineon Technologies Austria AG, Villach (AT)

(72) Inventors: Cesare Buffa, Villach (AT); Fernando Cardes Garcia, Leganés (ES); Luis Hernandez-Corporales, Madrid (ES); Bernhard Kuttin, Villach (AT); Andres Quintero Alonso, Leganés (ES); Andreas Wiesbauer, Poertschach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 15/493,252

(22) Filed: Apr. 21, 2017

(51) Int. Cl.
  H04R 1/04 (2006.01)
  H03M 3/00 (2006.01)
  H03K 3/03 (2006.01)
  H04R 19/04 (2006.01)
  H04R 19/00 (2006.01)

(52) U.S. Cl.
  CPC ............ H04R 1/04 (2013.01); H03K 3/0315 (2013.01); H03M 3/454 (2013.01); H04R 19/04 (2013.01); H04R 19/005 (2013.01)

(58) Field of Classification Search
  CPC .......... H03M 3/454; H03M 3/30; H04R 1/04; H04R 19/04; H04R 19/005; H03K 3/0315
  See application file for complete search history.

(56) References Cited

U.S. PATENT DOCUMENTS

| | | | | |
|---|---|---|---|---|
| 6,167,132 | A * | 12/2000 | Krone | H04L 25/0266 341/143 |
| 6,587,560 | B1 * | 7/2003 | Scott | H04L 25/0266 379/413.02 |
| 8,145,171 | B2 * | 3/2012 | Lin | H03L 7/07 455/260 |
| 8,471,743 | B2 * | 6/2013 | Huang | H03M 1/502 341/143 |
| 8,542,138 | B2 * | 9/2013 | Galton | H03M 3/388 341/118 |
| 9,014,398 | B2 * | 4/2015 | Onishi | H02M 3/07 381/111 |
| 9,577,663 | B1 * | 2/2017 | Paton Alvarez | H03M 3/464 |

(Continued)

FOREIGN PATENT DOCUMENTS

JP   2011109571 A   6/2011

OTHER PUBLICATIONS

Watanabe et al., "All-Digital MEMS Gyro-Sensor Using TAD-Digital-Synchronous-Detection (TAD-DSD) by TAD-ADPLL", 2015, 4 pages, IEEE.

(Continued)

*Primary Examiner* — David Ton
(74) *Attorney, Agent, or Firm* — Viering, Jentschura & Partner mbB

(57) ABSTRACT

In various embodiments, a circuit is provided. The circuit includes: a voltage biasing circuit coupled to a microelectromechanical system (MEMS) microphone sensor, the MEMS microphone sensor coupled to a driver circuit, and the driver circuit coupled to an oscillator-based ADC circuit. The oscillator-based ADC circuit may include an Nth order sigma-delta modulator, where N is an integer equal to or greater than 1.

18 Claims, 19 Drawing Sheets

(56) References Cited

U.S. PATENT DOCUMENTS

| | | | |
|---|---|---|---|
| 9,641,192 B1* | 5/2017 | Onishi | H03M 3/30 |
| 9,673,768 B2* | 6/2017 | Perrott | H03G 3/3026 |
| 2002/0060638 A1 | 5/2002 | Nishii et al. | |
| 2009/0066549 A1* | 3/2009 | Thomsen | H03M 3/482 |
| | | | 341/143 |
| 2013/0208915 A1* | 8/2013 | Hammerschmidt | H04R 3/00 |
| | | | 381/98 |
| 2014/0270261 A1 | 9/2014 | Wiesbauer et al. | |

OTHER PUBLICATIONS

Babaie-Fishani et al., "True high-order VCO-based ADC", Electronics Letters, Jan. 8, 2015, 2 pages, vol. 51, No. 1.

Young et al., "A 75dB DR 50MHz BW 3rd Order CT-$\Delta\Sigma$ Modulator Using VCO-Based Integrators", 2014 Symposium on VLSI Circuits Digest of Technical Papers, 2014, 2 pages, IEEE.

Soenmez et al., "Analysis and Design of VCO-Based Phase-Domain $\Sigma\Delta$ Modulators", IEEE Transactions on Circuits and Systems—I: Regular Papers, 2017, 10 pages, IEEE.

Hernandez et al., "Frequency-Encoded Integrators applied to Filtering and Sigma-Delta Modulation", 2016, pp. 478-481, IEEE.

\* cited by examiner

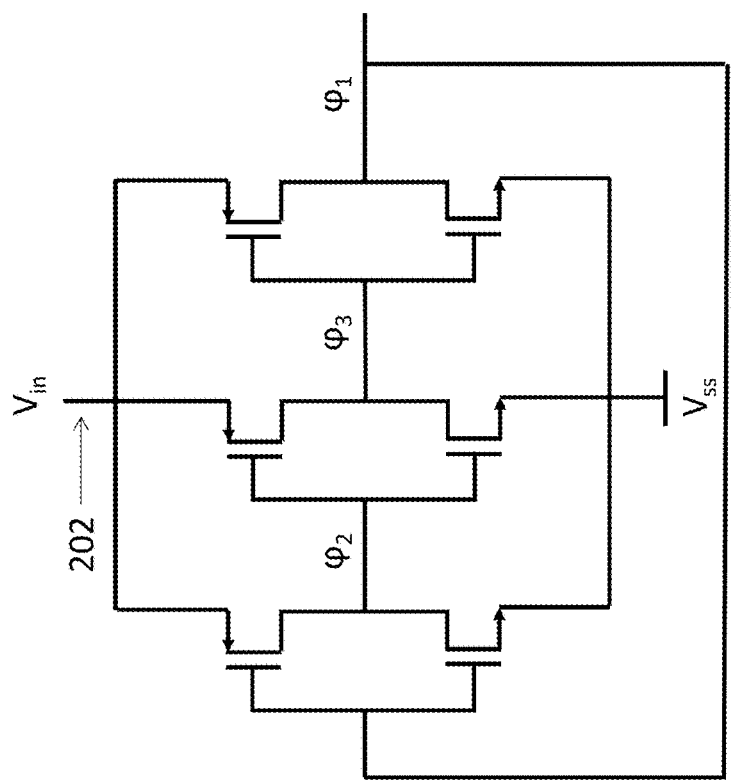

SIGMA DELTA MODULATOR FOR SENSORS

TECHNICAL FIELD

The present disclosure relates generally to a semiconductor circuit for a high order sigma delta modulator for sensors.

BACKGROUND

Microelectro-mechanical Systems (MEMS) microphones are commonly used in low power, battery operated devices that are sensitive to power consumption, such as, smartphones and tablet computers. MEMS microphones are popular with these applications because MEMS microphones can be implemented as a pressure sensitive diaphragm that is etched directly onto a silicon die with standard lithographic process.

The competitiveness of a microphone circuit is mainly given by its performance (dynamic range, resolution, power consumption, clock jitter tolerance . . . ) and its cost (silicon area, MEMS sensor complexity, package size vs. sensitivity . . . ). In a typical MEMS microphone circuit, a MEMS microphone is coupled to an integrated circuit that biases the MEMS microphone, amplifies the output of the MEMS microphone, and performs and analog-to-digital conversion (ADC) on the electrical output of the MEMS microphone. Each of these functions consumes power and may consume valuable chip and/or board area. To reduce power consumption and chip area, conventional voltage-encoding-based sigma delta ADCs have been used as the ADC in microphone circuits. However, the sigma delta ADCs currently available have been pushed to technology limits and market trends require innovative solutions. Time-encoding-based solutions are promising alternatives to the voltage-encoding-based circuits conventionally used.

SUMMARY

In various embodiments, a circuit may include a voltage biasing circuit coupled to a microelectro-mechanical system (MEMS) microphone sensor, the MEMS microphone sensor coupled to a driver circuit, and the driver circuit coupled to an oscillator-based ADC circuit. The oscillator-based ADC circuit may include an Nth order sigma-delta modulator, where N is an integer equal to or greater than 1.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIGS. 4A-4D illustrate a schematic diagram of a voltage-controlled oscillator of a sensor readout circuit according to at least one embodiment;

DETAILED DESCRIPTION

Various embodiments of the invention are explained in greater detail below, with reference to the accompanying figures. However, the invention is not restricted to the embodiments specifically described, but rather can be more suitably modified and altered. It lies within the scope of the invention to combine individual features and feature combinations of one embodiment with features and feature combinations of another embodiment in order to arrive at further embodiments according to the invention.

Identical elements are provided with the same or similar reference signs in the figures. A repeated description of these elements has been dispensed with in order to avoid repetition.

The basic principle presented here will be elucidated on the basis of the examples given below.

The various embodiments relate to a data conversion circuit for a capacitive signal source such as a MEMS sensor or microphone, and capacitive sensors such as pressure sensors and accelerometers. The data conversion circuit may also be applied to other types of circuits and systems, such as audio systems, communication systems, sensor systems and other systems that interface to frequency coded signals.

In various embodiments, a continuous time sigma delta (IA) modulator based only on voltage-controlled oscillators (VCOs) and digital logic is provided. In other embodiments, other oscillators, for example, current-controlled oscillators and capacitance controlled oscillators may also be used in the continuous time ΣΔ modulator. This ΣΔ modulator is competitive with respect to existing ADCs in terms of area, power consumption, dynamic range and jitter tolerance. An oscillator may be used as an initial integrator of a ΣΔ modulator and a frequency to digital converter may be used after the oscillator in order to achieve a loop order and the corresponding noise shaping of any degree.

Figure 1A:
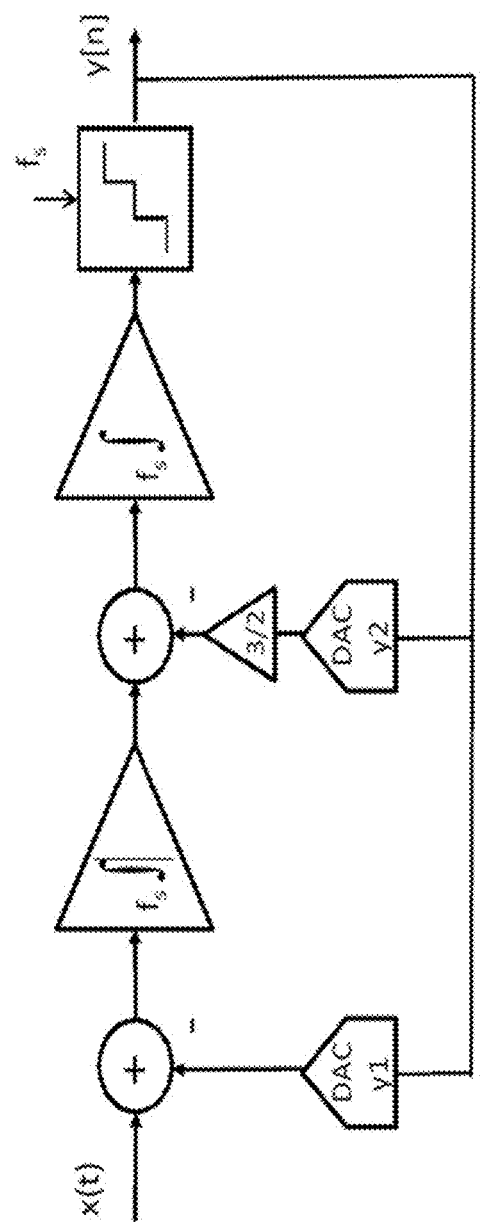
FIG. 1A illustrates a block diagram of a generic analog second order continuous time sigma delta modulator.
Figure 1B:
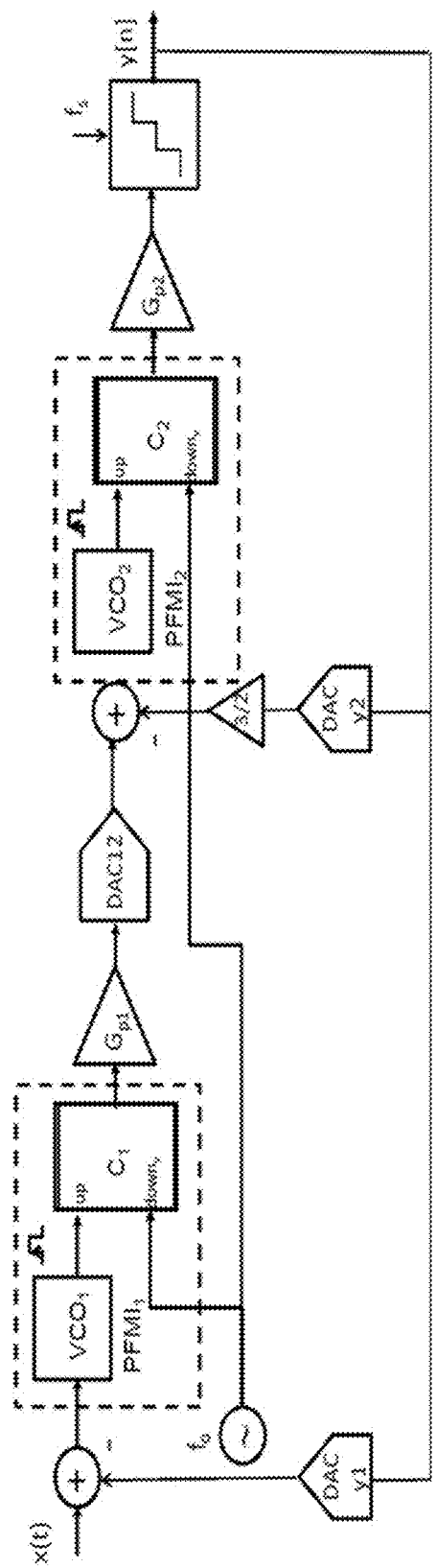
FIG. 1B illustrates a block diagram of a mostly digital multi-bit second order continuous time sigma delta modulator.

FIG. 1A illustrates a block diagram of a generic analog second order continuous time sigma delta modulator. FIG. 1B illustrates a block diagram of a mostly digital multi-bit second order continuous time sigma delta modulator. As shown in FIG. 1B, the loop interface requires a digital-to-analog converter (DAC) and multibit interconnections that require complex routing and occupy substantial die area.

Figure 2A:
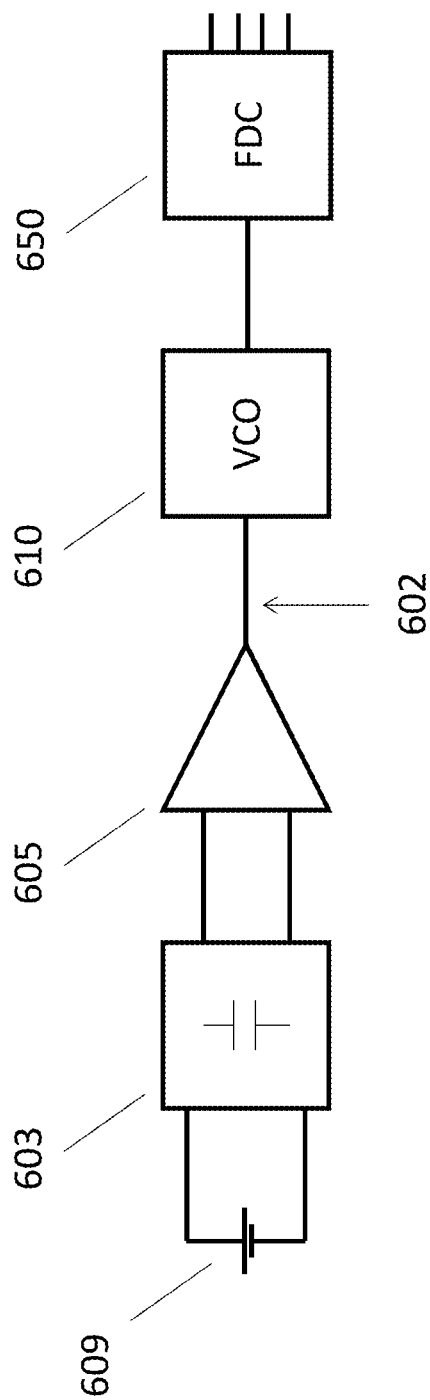
FIG. 2A illustrates a block diagram of various embodiments of a MEMS microphone coupled to a VCO-based ADC.

FIG. 2A illustrates a block diagram of various embodiments of a MEMS microphone coupled to a VCO-based ADC. Referring to FIG. 2A, the circuit may include a bias circuit 609, a capacitive MEMS microphone sensor 603, an interface amplifier 605, a voltage-controlled oscillator (VCO) 610, and a frequency-to-digital converter (FDC) 650. The bias circuit 609 may be configured based on the operating condition of the capacitive MEMS microphone sensor 603. The interface amplifier 605 may receive the output of the microphone sensor 603 and provide a low level audio signal 602 to drive a sensor readout circuit that may include the VCO 610 and the FDC 650. The VCO 610 converts the voltage-based audio signal 602 into a frequency based signal which is then converted into a digital signal by the FDC 650.

Figure 2B:
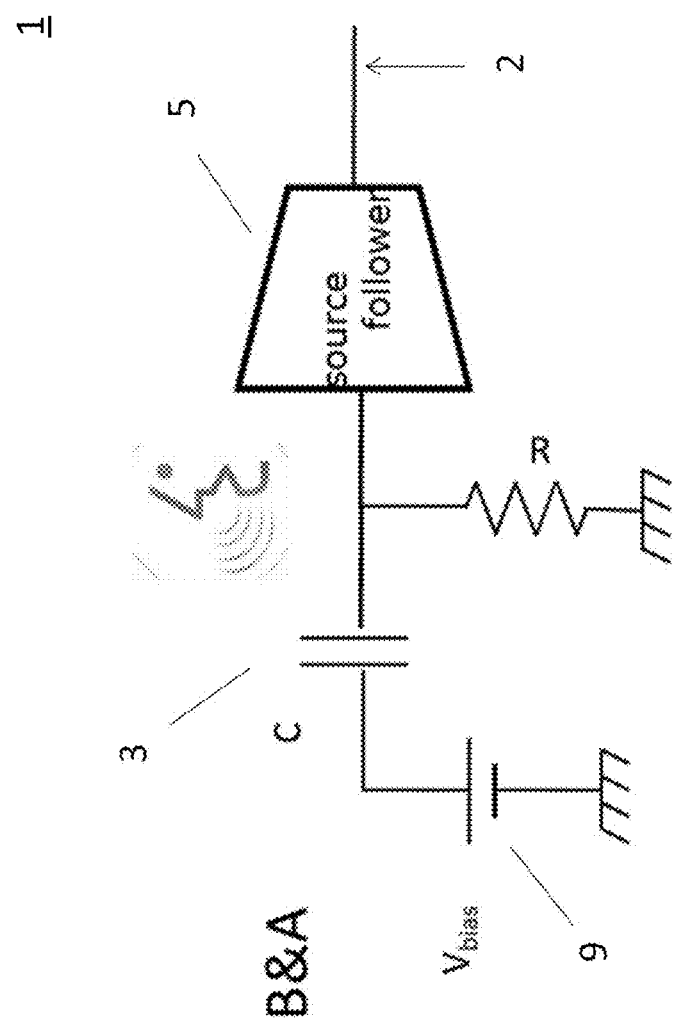
FIG. 2B illustrates a block diagram of various embodiments of a microphone biasing and amplification circuit.

FIG. 2B illustrates a block diagram of various embodiments of a microphone biasing and amplification circuit 1. As shown in FIG. 2B, a MEMS microphone 3 is coupled to a voltage biasing circuit 9 and a voltage amplifying circuit 5. For example, the biasing voltage may be in the range of about 10 V. The output voltage signal 2 may be provided to a sensor readout circuit. The voltage amplifying circuit 5 may be a source follower circuit configured to amplify the higher impedance output of a MEMS sensor to drive the lower input impedance of a sensor readout circuit. This biasing and amplification circuit configuration which is based on constant charge biasing and voltage readout features a low-noise interface and good linearity up to high sound pressure levels. The biasing and amplification circuit 1 can be extended to a differential sensor as well. In other embodiments, a transconductor may be included instead of a voltage amplifying circuit for impedance matching to drive the input of a sensor readout circuit.

Figure 2C:
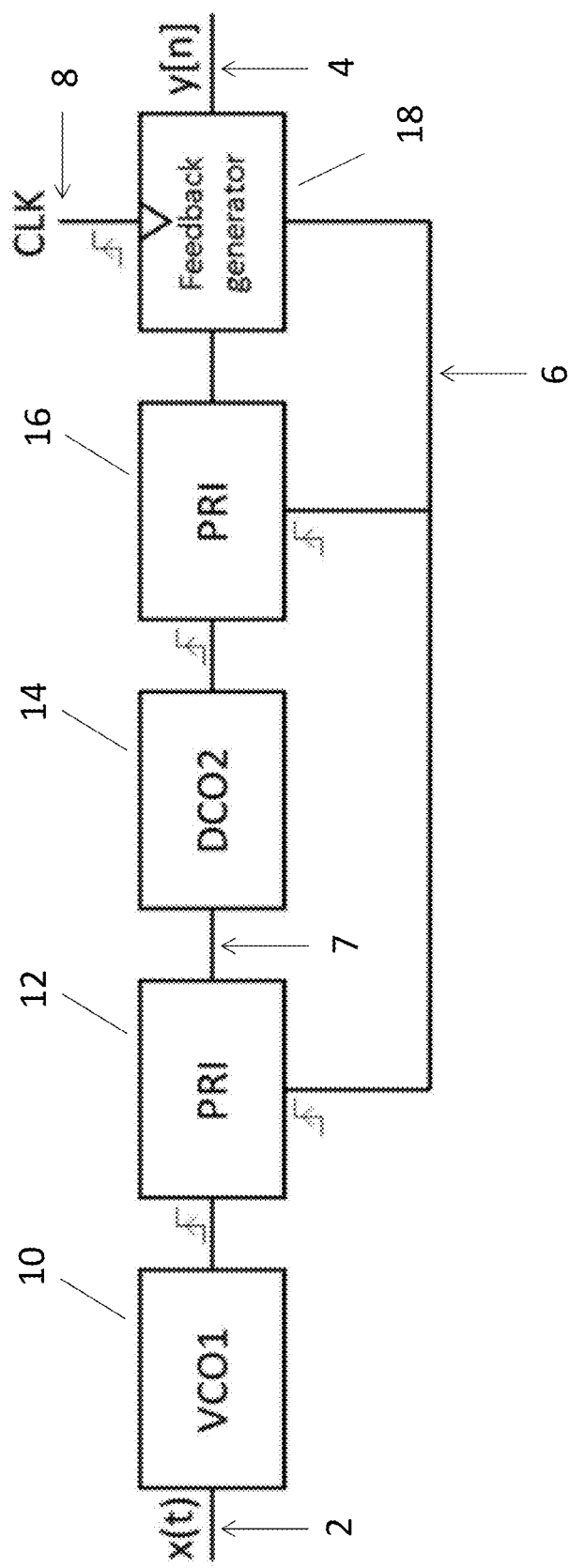
FIG. 2C illustrates a block diagram of various embodiments of a sensor readout circuit having single-bit interconnections in a single-ended converter configuration.

FIG. 2C illustrates a block diagram of various embodiments of a sensor readout circuit 11 having single-bit interconnections. As shown in FIG. 2C, the sensor readout circuit 11 is configured as a ΣΔ modulator in a single-ended converter configuration. Referring to FIG. 2C, an analog voltage signal x(t) provided from a capacitive sensor, such as a MEMS microphone, drives the input of a voltage-controlled oscillator (VCO) 10. The VCO 10 transforms the input signal x(t) into the square wave w(t) which shows frequency modulation. The signal voltage x(t) controls the oscillation frequency of the VCO 10, whose output is the frequency modulated signal w(t). The VCO 10 should be configured to have the combination of linearity, sensitivity (MHz/V), and low phase noise in order to be coupled to for example the biasing and amplification circuit shown in FIG. 2B. Low phase noise may be achieved by properly sizing the transistors depending on the requirements the target SNDR, area, and power consumption. The VCO 10 performs the voltage-to-frequency conversion is used as an initial integrator of a ΣΔ modulator.

The output of the VCO 10 is provided to an input of a phase referenced integrator (PRI) 12. The PRI 12 may convert the frequency modulated signal into a digital signal. The output of PRI 12 is set to a logic high ('1') on each rising edge of the signal from VCO 10, and it is reset on each rising edge of the feedback pulse 6. The PRI 12 may be a one-bit counter. In this simple form, the PRI 12 resembles the typical phase and frequency comparator of PLL circuits.

The single-bit output 7 of the PRI 12 is provided to an input of a digitally-controlled oscillator (DCO) 14 that only has two possible oscillation frequencies. Therefore, linearity is not a problem, and phase noise is not critical because the oscillation frequency shift is typically large. However, this oscillation frequency has to be able to quickly change, given that its input signal is composed by pulses of nanoseconds or even shorter periods.

The output of the DCO 14 is provided to an input of another phase referenced integrator PRI 16. The PRI 16 may be identical to the PRI 12. Accordingly, its output is also a single bit and is set to a logic high ('1') on each rising edge of the signal from DCO 14.

The single-bit output of the PRI 16 is provided to an input of the feedback generator 18. An output of the feedback generator 18 is provided to an input of the PRI 12 and an input of the PRI 16. The feedback generator 18 samples the output of the PRI 16 on each rising edge of the sampling clock 8. If the sampled value is a logic high ('1'), it generates a pulse that resets the value of both PRI 12 and PRI 16.

Figure 2D:
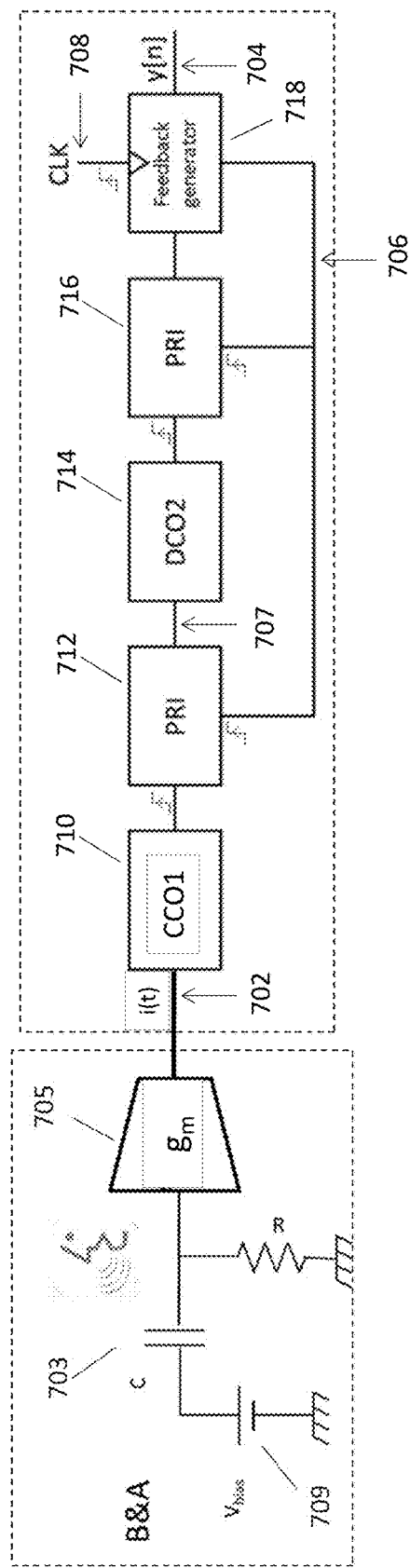
FIG. 2D illustrates a block diagram of various embodiments of a microphone biasing and amplification circuit and a current-controlled oscillator-based ADC having single-bit interconnections in a single-ended converter configuration.
Figure 2E:
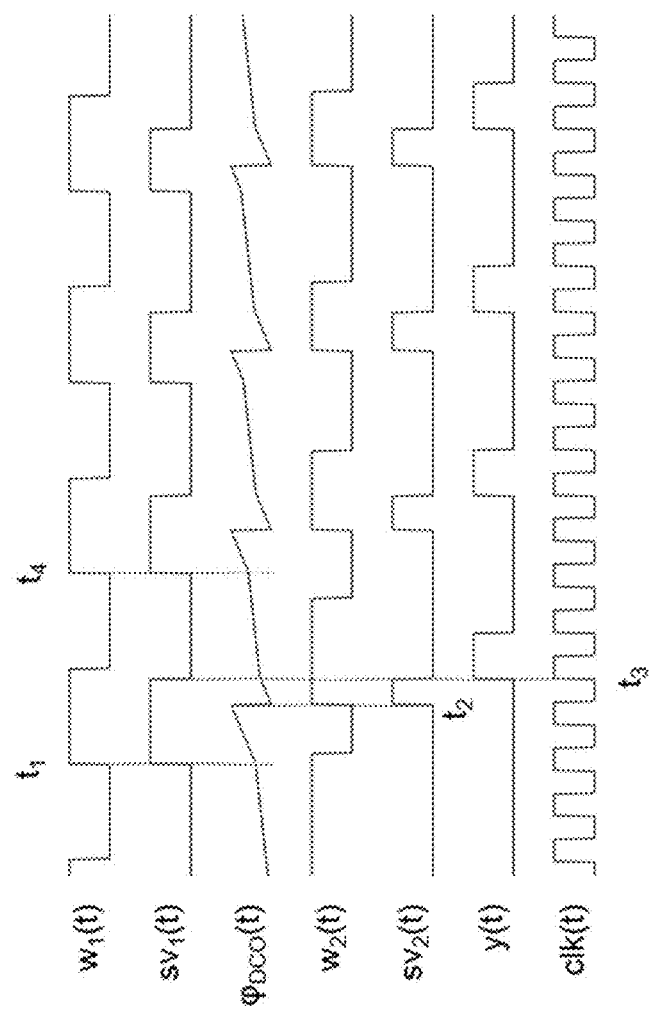
FIG. 2E illustrates an operational behavior of a sensor readout circuit according to at least one embodiment.

FIG. 2E illustrates an operational behavior of a sensor readout circuit according to at least one embodiment. Referring to FIG. 2E, at time $t_1$, the rising edge in the output of the VCO 10 ($w_1(t)$) sets the output of the PRI 12 ($sv_1(t)$) to '1'. When this happens, the frequency of the DCO 14 changes from a lower oscillation frequency to a higher oscillation frequency, so its phase ($\varphi_{DCO}(t)$) climbs at a higher rate. At time $t_2$, this phase reaches $2\pi$, which generates a rising edge on the output of the DCO 14 ($w_2(t)$) and therefore the output of the PRI 16 ($sv_2(t)$) is set to '1'. At time $t_3$, the first rising edge of the sampling clock (clk) after the output of the PRI 16 ($sv_2(t)$) is set to '1' samples the output of the PRI 16 ($sv_2(t)$) and generates a short feedback pulse ($FB_{pulse}$) which clears both PRIs. This sets the oscillation frequency of the DCO 14 back to the lower oscillation frequency until $t_4$, the next rising edge in the output of the VCO 10 ($w_1(t)$). The output of this system shows second order noise shaping.

Figure 3:
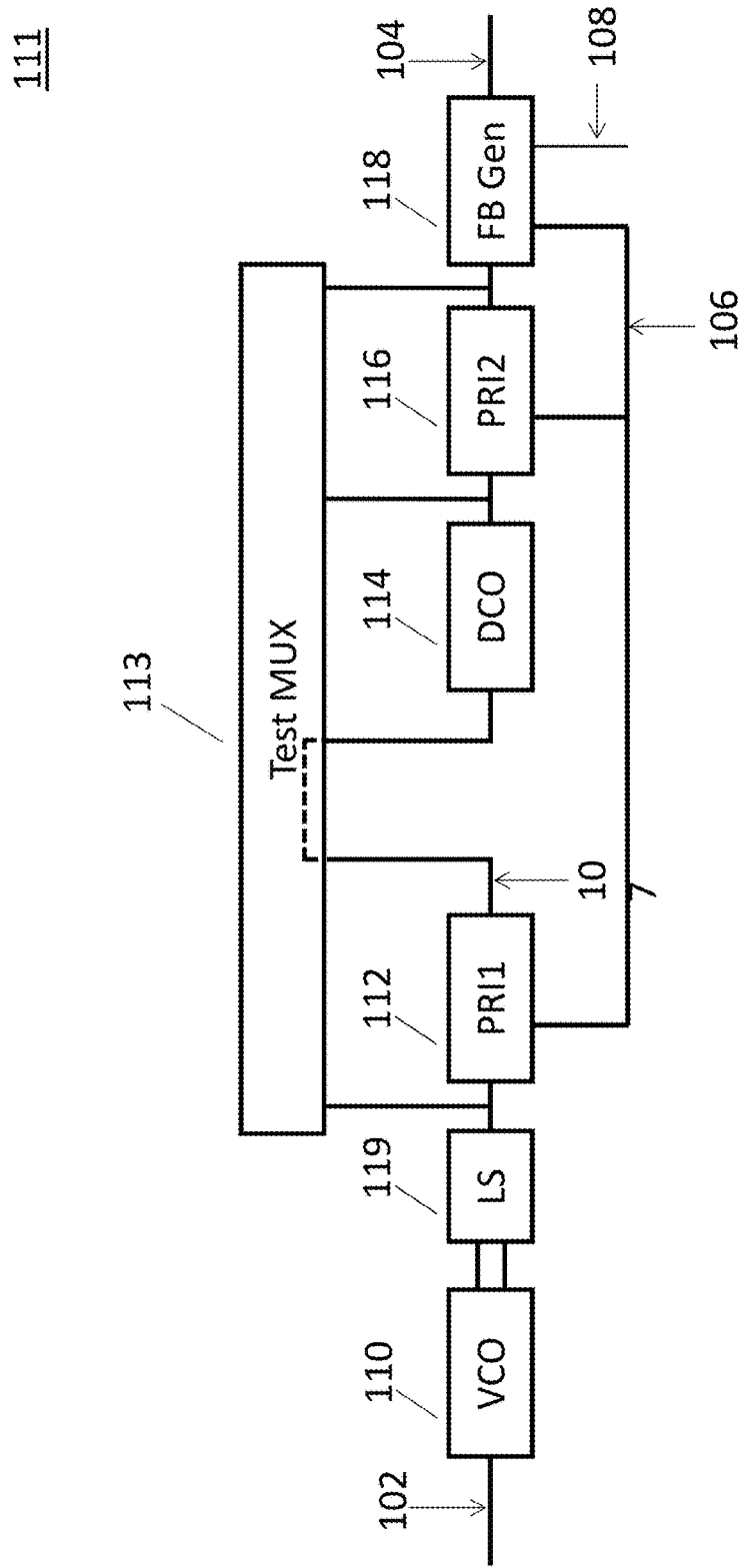
FIG. 3 illustrates a schematic diagram of a sensor readout circuit according to at least one embodiment.
Figure 4C:
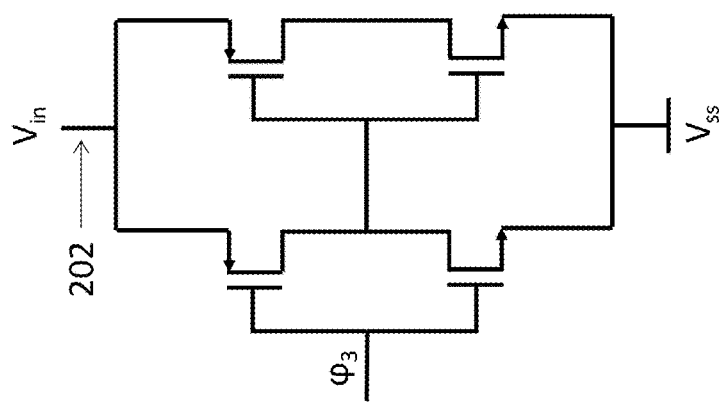
Figure 4B:
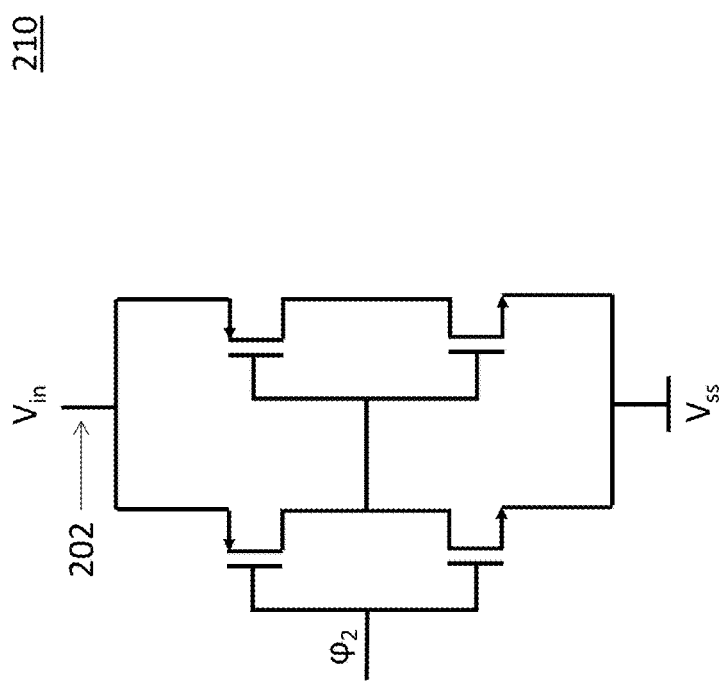
Figure 4D:
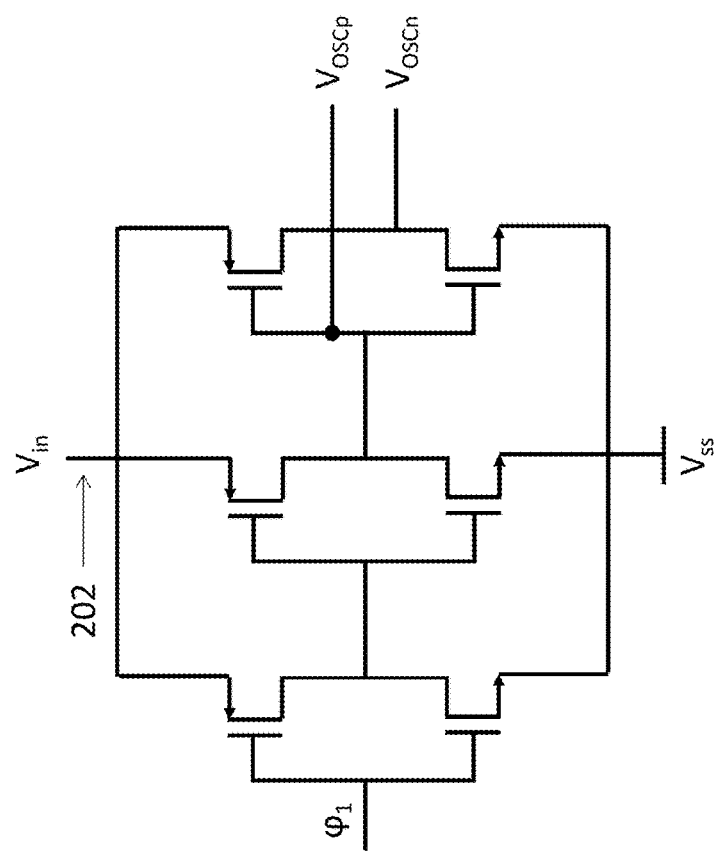

FIG. 3 illustrates a schematic diagram of a sensor readout circuit 111 according to at least one embodiment. Referring to FIG. 3, an analog signal x(t) 102 (e.g., voltage signal) provided from a capacitive sensor, such as a MEMS microphone, drives the input of a voltage-controlled oscillator (VCO) 110. A typical input signal x(t) 102 has a large dynamic range and it is noisy. For example, noise may be introduced at the MEMS sensor or from other electronics noise sources between the MEMS sensor and the input of the sensor readout circuit 111. In general, the noise may be white noise and/or flicker noise. Thus, the phase noise of the oscillator receiving the input signal x(t) 102 should be low enough not to reduce the signal-to-noise ratio (SNR). For example, a ring oscillator may be used due to its sensitivity and low phase noise. FIGS. 4A-4D illustrate a schematic diagram of a voltage-controlled oscillator 210 of a sensor readout circuit according to at least one embodiment. Referring to FIGS. 4A-4D, VCO 210 may be a simple 3-stage ring oscillator that is directly modulated by the signal 202. For example, the oscillation frequency of VCO 210 may be about 4.8 MHz, and its sensitivity may be about 7.2 MHz/V. Referring to FIG. 4D, a buffer may be used to square the oscillation and drive the level shifter. Referring to FIGS. 4B and 4C, dummy buffers may be used for symmetry. The size of the transistors may be optimized to minimize the phase noise. This implementation is characterized by a low input impedance which requires an appropriate driver, for example, such as the circuit shown in FIG. 2B. However, the VCO 210 may be designed to target a different input impedance.

In other embodiments, the VCO 210 may be an M-stage ring oscillator depending on a desired delay, where M is an integer equal to or greater than 1. Other topologies of ring oscillators (e.g., differential, driven in current, other topologies of delays) may also be used. Alternatively, relaxation oscillators (e.g., driven in current, in voltage) and reactance-controlled oscillators (i.e., the MEMS sensor directly connected to the oscillator) may also be used.

Figure 5:
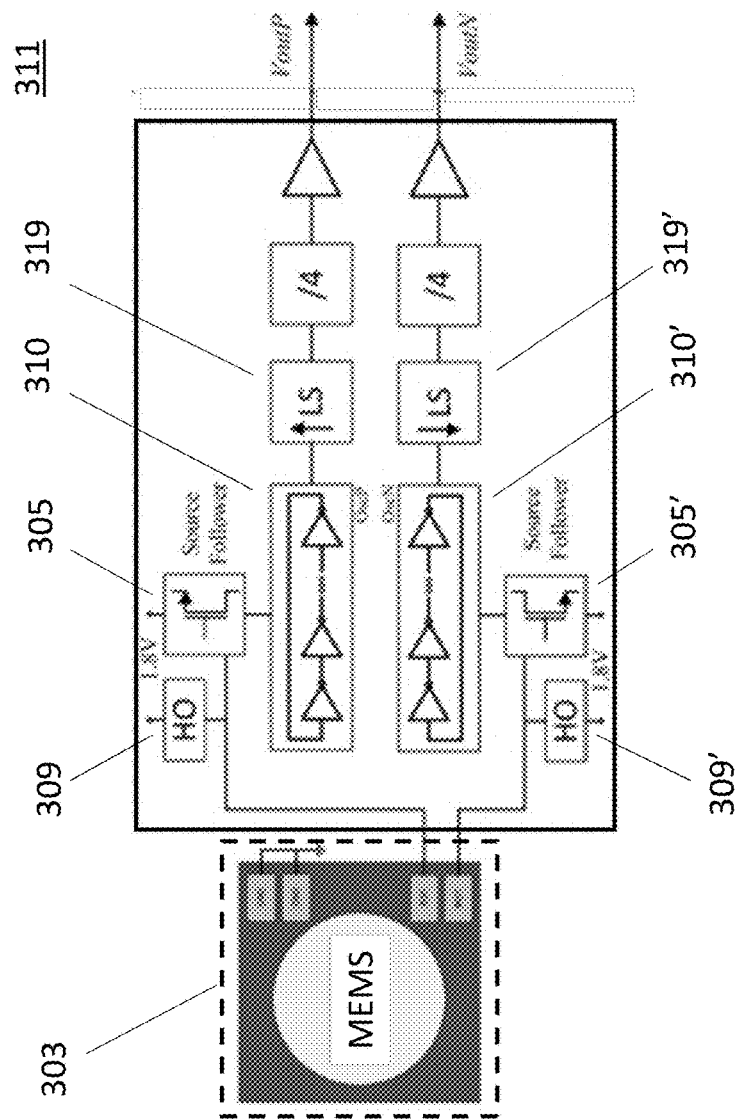
FIG. 5 illustrates a block diagram of a voltage-controlled oscillator of a sensor readout circuit including a monolithically integrated biasing and amplification circuit according to at least one embodiment.

FIG. 5 illustrates a block diagram of a voltage-controlled oscillator 311 of a sensor readout circuit in a pseudo-differential configuration according to at least one embodiment where the biasing stages 309 and 309' for the MEMS sensor 303 and the amplification stages including source follower buffers 305 and 305' are incorporated in an integrated circuit package.

Referring to FIG. 3, the outputs of the VCO 110 may be provided to the inputs of a level shifter (LS) 119. The level shifter 119 converts or adapts the varying-amplitude of the VCO 110 to the voltage supply of the digital circuitry. For example, the voltage supply of the digital circuit may be 1.8 V.

Figure 6:
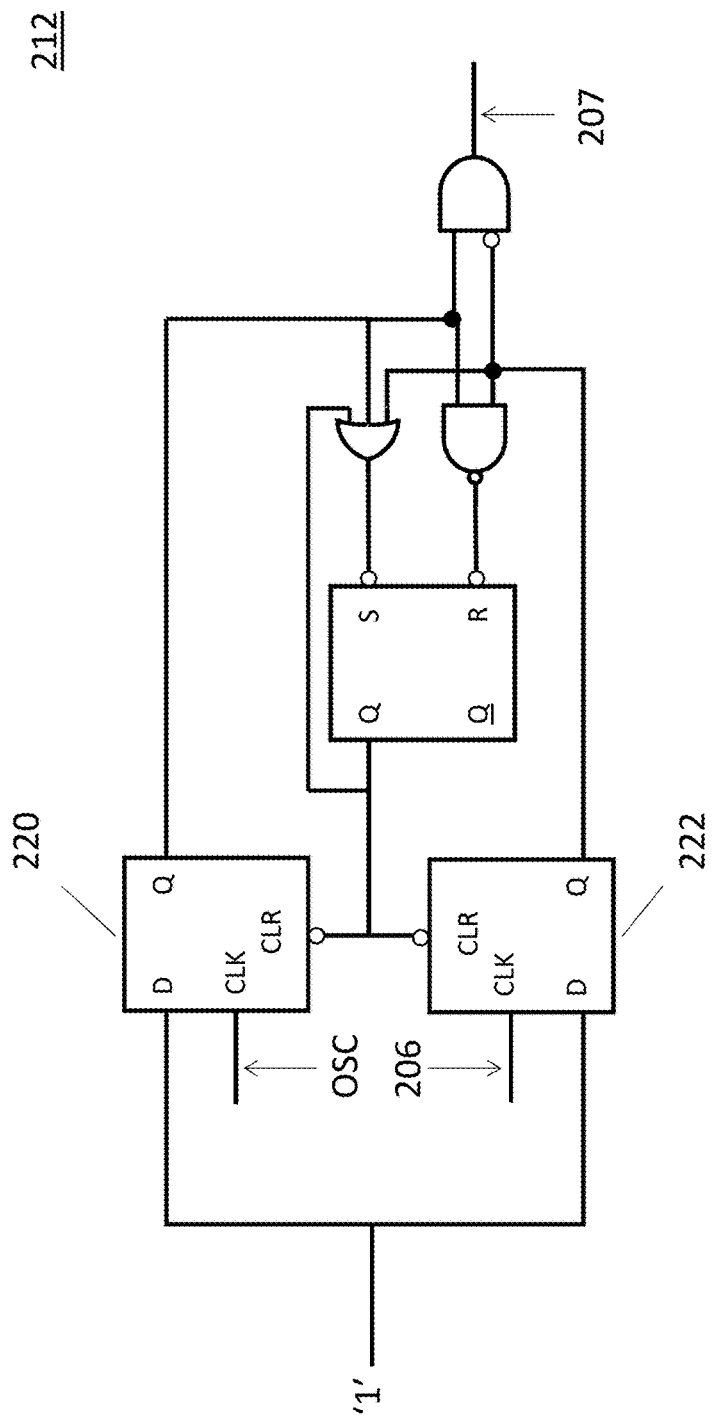
FIG. 6 illustrates a schematic diagram of a phase referenced integrator of a sensor readout circuit according to at least one embodiment.

The output of the level shifter 119 may be provided to the input of a first phase referenced integrator (PRI) 112. The first PRI 112 may be a one-bit counter. FIG. 6 illustrates a schematic diagram of a phase referenced integrator 212 of a sensor readout circuit according to at least one embodiment. Referring to FIG. 6, the PRI 212 may be composed of two D-type flip-flops. One flip-flop 220 may be triggered by the output of an oscillator, while the other flip-flop 222 may be triggered by the feedback pulse 206 from a feedback generator. When both flip-flops are set to a logic high ('1'), both are immediately reset. Although this counter has 3 states (and therefore its output should have 2 bits), it was observed that one of the states was mostly unused and the output has been restricted to 1 bit for simplicity. The output of the PRI 212 is set to a logic high ('1') on each rising edge of the signal from the oscillator, and it is reset on each rising edge of the feedback pulse 206. In simulations, an edge of one input is always followed by an edge of the other one, so two consecutive edges of the same input never occur and therefore the PRI never gets saturated. In other embodiments, the first PRI 112 may be a 1-bit up/down counter whose value is increased on each rising edge of the signal from the oscillator and decreased on each rising edge of the feedback pulse.

Figure 7:
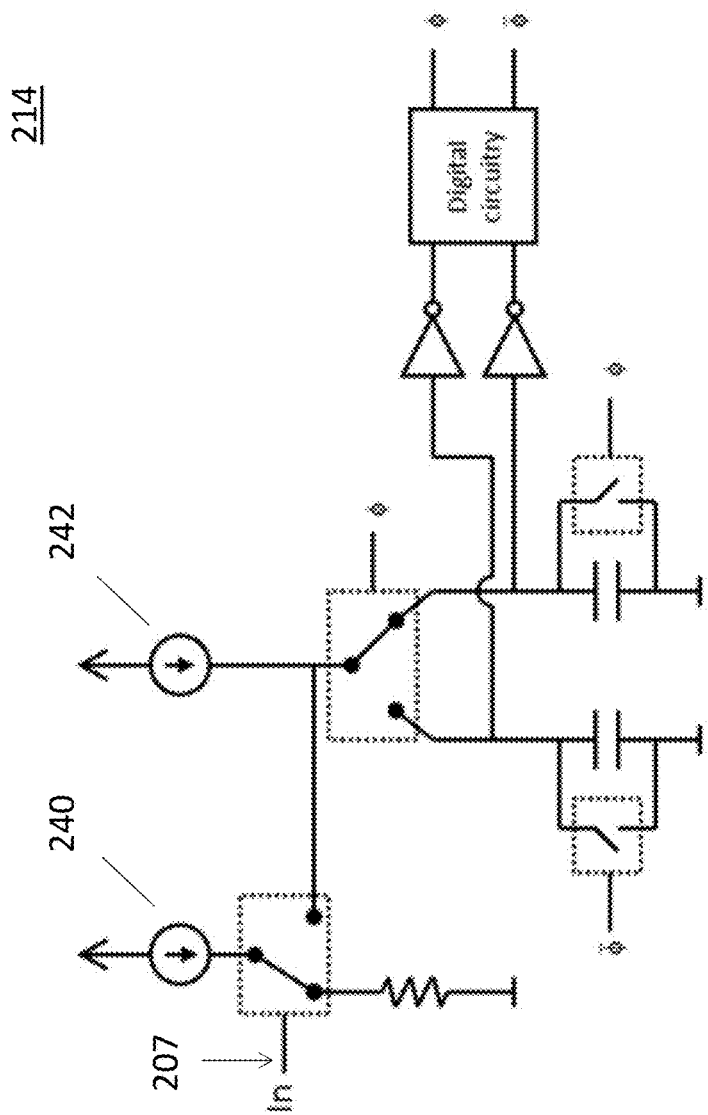
FIG. 7 illustrates a schematic diagram of a digitally-controlled oscillator of a sensor readout circuit according to at least one embodiment.

Referring to FIG. 3, the single-bit output of the first PRI 112 is provided to an input of a digitally-controlled oscillator 114. The DCO 114 may only oscillate at two different frequencies, for example, a lower frequency of about 2.5 MHz and a higher frequency of about 10 MHz. Because these frequencies are very different, the error introduced by the phase noise is in comparison small so this oscillator can exhibit higher phase noise without any impact on the resolution of the ADC. However, since the input to the DCO 114 may be composed by pulses of nanoseconds or even shorter periods, the voltage-to-frequency response of the DCO 114 should be fast enough to follow very quick changes in the control input. For example, such a DCO may be implemented as a 1-bit current DAC followed by a current-controlled oscillator. The 1-bit current DAC converts the digital voltage signal provided by the first PRI into a digital current signal for controlling a current-controlled oscillator. FIG. 7 illustrates a schematic diagram of a digitally-controlled oscillator of a sensor readout circuit according to at least one embodiment. Referring to FIG. 7, the 1-bit current DAC may include a current source 242 which provides a constant current (e.g., 5 µA) to the output and a current source 240 which provides a current (e.g., 15 µA) that may be added to the output or shunted away through a resistor to maintain the current source properly biased. The current-controlled oscillator may be a relaxation oscillator that includes two capacitors and digital circuitry. As shown in FIG. 7, one possible implementation is using a 2-capacitor relaxation oscillator whose oscillation frequency depends on the capacitance, the threshold voltage set by a comparator (inverter), and the charging current. Referring to FIG. 7, when the input voltage is low, only one current source 242 is used to charge the capacitors and the oscillation frequency may be about 2.5 MHz. When the input voltage is high, another current source 240 is connected in parallel and the oscillation frequency may reach about 9.5 MHz. In other embodiments, the DCO may be implemented with a ring oscillator (e.g., differential, driven in current, other topologies of delays) or a reactance-controlled oscillator.

Referring to FIG. 3, a multiplexer 113 may be added between the first PRI 112 and the DCO 114 for test purposes. The signals are merely passed through the multiplexer 113 for external monitoring.

The output of the DCO 114 is provided to an input of a second phase referenced integrator, PRI 116. The second PRI 116 may be identical to the first PRI 112. Accordingly, the output of the second PRI 116 is also a single bit and is set to a logic high ('1') on each rising edge of the signal from DCO 114, and it is reset on each rising edge of the feedback pulse 206.

Figure 8:
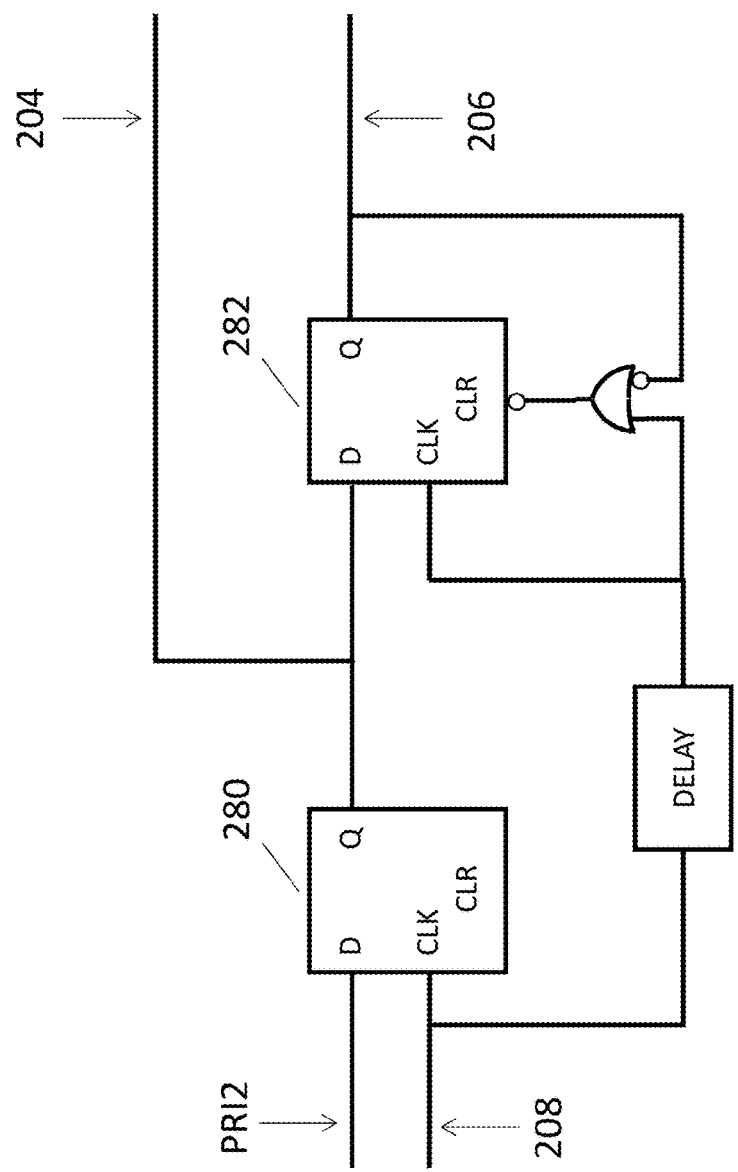
FIG. 8 illustrates a schematic diagram of a feedback generator of a sensor readout circuit according to at least one embodiment.

The single-bit output of the second PRI 116 is provided to an input of the feedback generator 118. FIG. 8 illustrates a schematic diagram of a feedback generator 218 according to at least one embodiment. Referring to FIG. 8, the feedback generator 218 may be composed of two flip-flops and a few logic gates. One flip-flop 280 generates the output bit-stream y[n] by sampling the output of the second PRI. Another flip-flop 282 uses a delayed clock to generate a feedback pulse 206 having a duration $T_s/2$ when the sampled output of the second PRI is a logic high ('1'). More specifically, the flip-flop 282 samples the output of the second PRI with a delayed clock and generates a feedback pulse 206 every time it samples a '1'. The feedback pulse 206 is provided to each PRI in order to decrease or reset their values.

Figure 9:
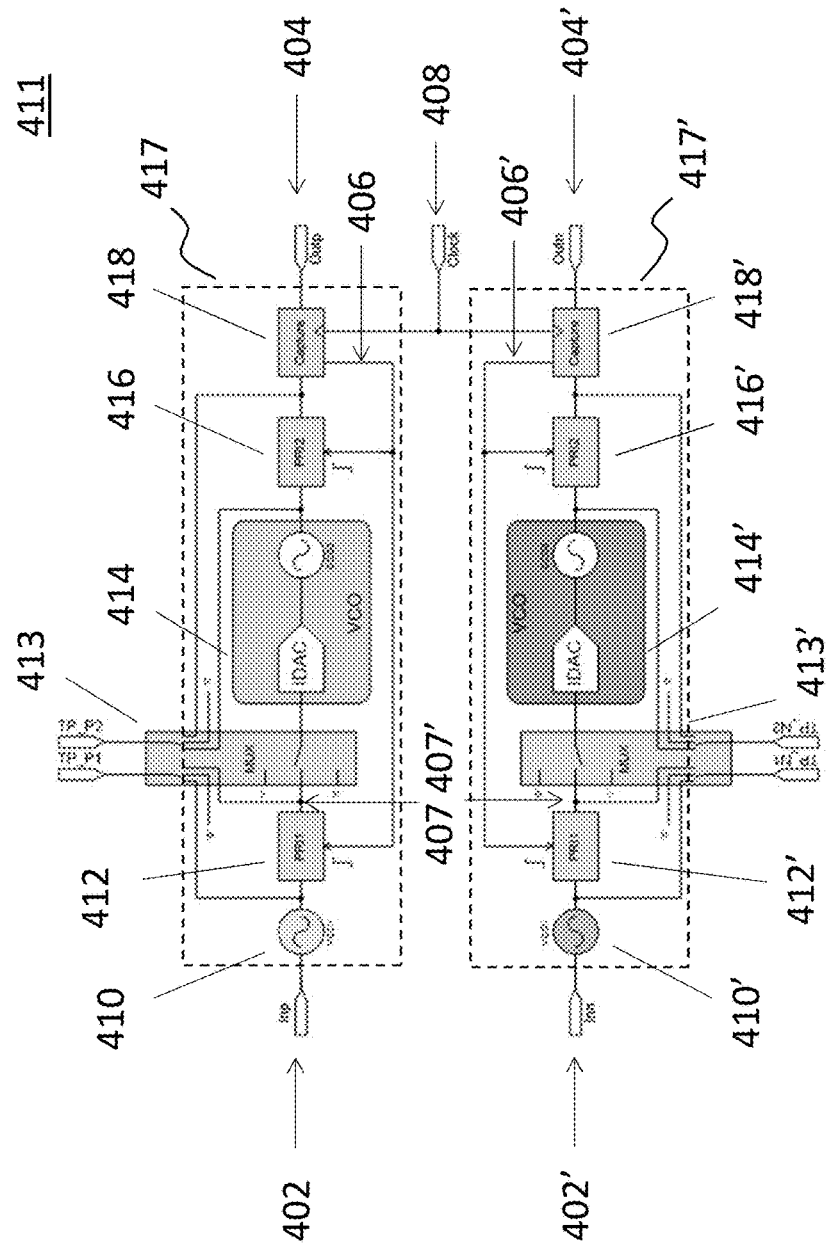
FIG. 9 illustrates a block diagram of various embodiments of a sensor readout circuit in a pseudo-differential converter configuration.

A VCO-based ADC sensor readout circuit can be implemented in a single-ended converter configuration. It can also be implemented in a pseudo-differential converter configuration using two identical signal paths. The pseudo-differential architecture may be used to minimize distortion which is produced by any non-linearity between the oscillation frequency and the input voltage. In the pseudo-differential topology, the even harmonics are canceled and the distortion is reduced to the odd harmonics. The pseudo-differential topology significantly improves the PSRR and shows an improvement in terms of tolerance to clock jitter. FIG. 9 illustrates a block diagram of various embodiments of a sensor readout circuit 411 in a pseudo-differential converter configuration. Referring to FIG. 9, the top path 417 may be a first sensor readout circuit in a single-ended converter configuration and the bottom path 417' may be a second sensor readout circuit in a single-ended converter configuration. A differential MEMS sensor provides a signal 402 and a signal 402' that should be about 180° out of phase with the signal 402. The signals 402 and 402' are provided to the top and bottom paths, respectively. The outputs of the top and bottom paths 404 and 404' respectively, are subtracted from each other to generate a differential output signal.

A VCO-based ADC sensor readout circuit configured in a pseudo-differential configuration was first simulated in MATLAB and then an implementation with standard CMOS 130 nm was simulated in Cadence environment. Subsequently, a silicon chip implementing sensor readout circuits in a single-ended converter configuration and in a pseudo-differential converter configuration was fabricated. Table 1 shows the experimental measurements of a sensor readout circuit in the pseudo-differential converter configuration.

TABLE 1

Experimental Measurements for Differential Configuration

| | |
|---|---|
| SNDR at 94 dB SPL | 69 dB-A |
| AOP | 125 dB SPL |
| Dynamic Range | 100 dB |
| CMRR without calibration | 52 dB |
| Maximum CMRR obtained | 87 dB |
| Current consumption | 314 μA (margin to optimize) |
| ADC silicon area | 40,000 μm² (200 μm × 200 μm if square layout is used) |
| Sampling frequency | 20 MHz |

Figure 10:
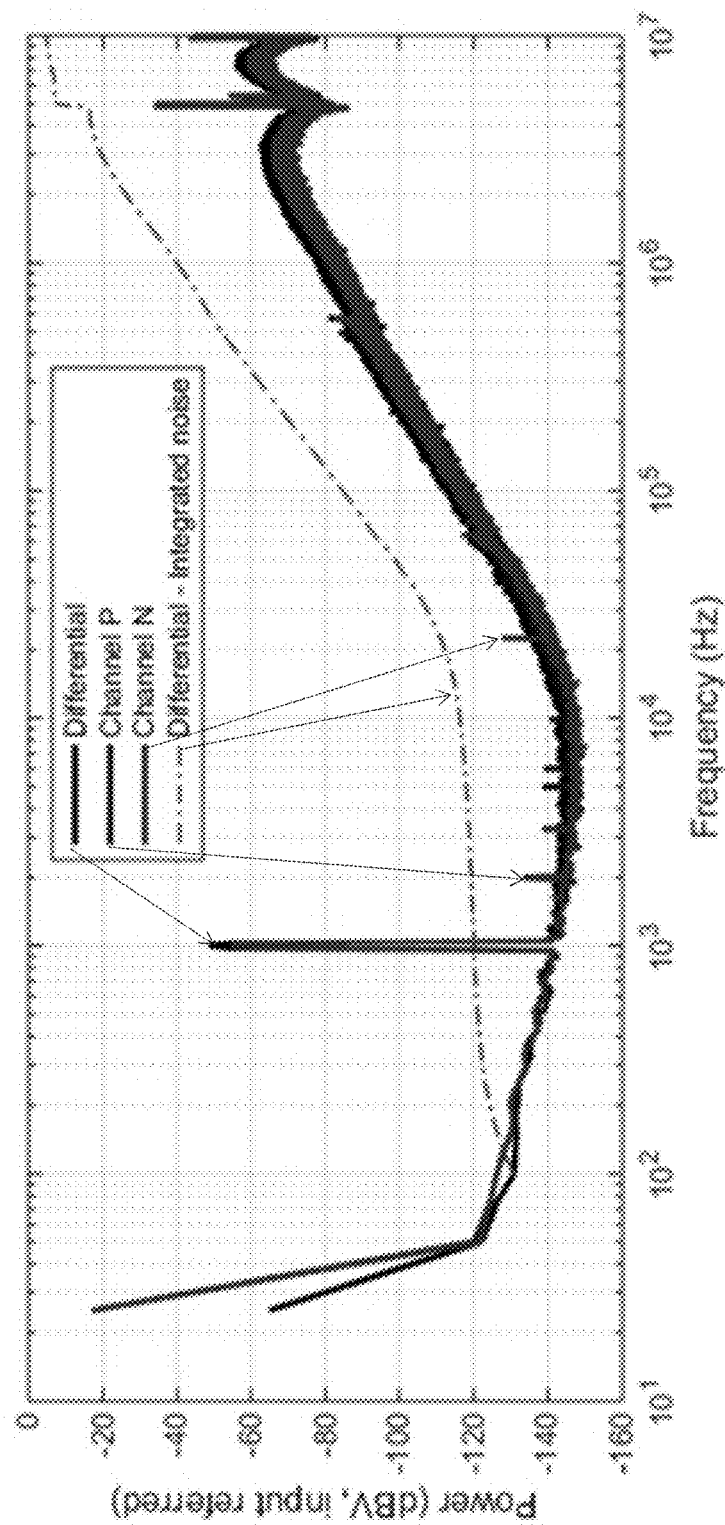
FIG. 10 is a graph showing the measured spectrum of a sensor readout circuit in a pseudo-differential converter configuration according to at least one embodiment.

The reference input for testing microphones is an acoustic tone of 94 dB SPL at 1 kHz. Typically, 6 mVrms is the amplitude of the analog output when such an acoustic tone is applied to a microphone. The experimental measurements were taken when a 6 mVrms 1 kHz tone with opposite phases was applied to each input of a sensor readout circuit in the pseudo-differential configuration. FIG. 10 is a graph showing the measured power spectrum of a P-channel, N-channel, and their difference in a sensor readout circuit in a pseudo-differential configuration according to at least one embodiment when a 6 mVrms 1 kHz tone is applied to each input with opposite phases. As shown in FIG. 10, the measured sensor readout circuit has a strong frequency response at the frequency of the test signal and generally shifts the noise into the higher frequency spectrum where it can be filtered out. FIG. 10 also shows that the differential signal may have a better frequency response than the individual channels of a sensor readout circuit.

The signal-to-noise and distortion ratio (SNDR) is typically measured applying an A-weighting filter to the output. The SNDR of this converter at 94 dB SPL after the A-weighting is 69 dB using the pseudo-differential configuration. In the case of the single channel ADC, the SNDR is about 65 dB.

Figure 11:
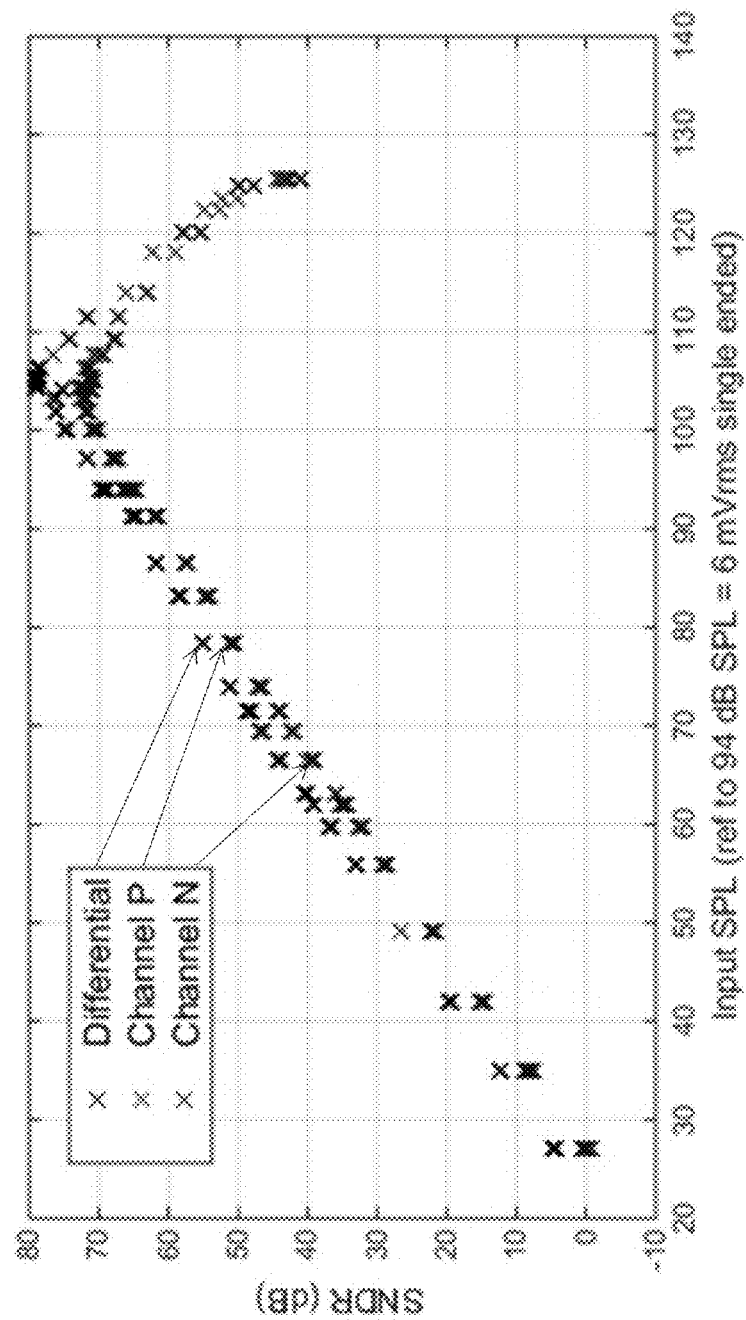
FIG. 11 is a graph showing the measured dynamic range plot of a sensor readout circuit in a pseudo-differential converter configuration according to at least one embodiment.

FIG. 11 is a graph showing the measured dynamic range plot of a P-channel, N-channel, and their difference for a sensor readout circuit in a pseudo-differential configuration according to at least one embodiment. The graph shows that a differential configuration improves the SNDR. Referring to FIG. 11, the dynamic range is about 100 dB, and the SNDR peak reaches about 80 dB at 105 dB SPL using the differential topology.

Figure 12:
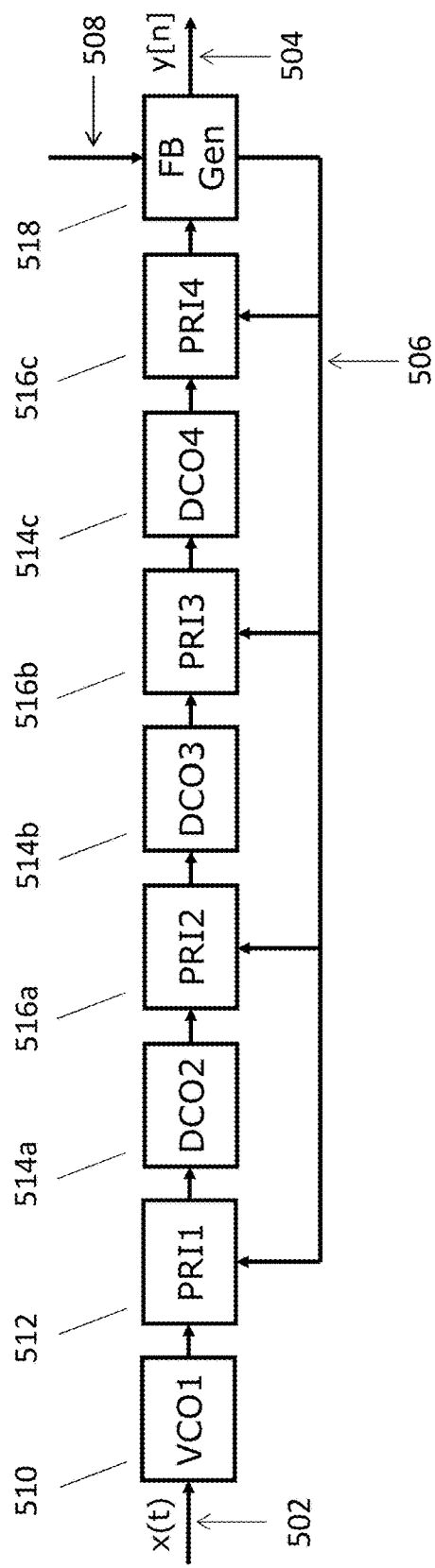
FIG. 12 illustrates a block diagram of various embodiments of a higher order sensor readout circuit.

In various embodiments, a sensor readout circuit may be a high order VCO-based sigma-delta ADC. FIG. 12 illustrates a block diagram of various embodiments of a higher order sensor readout circuit 511. More specifically, FIG. 12 shows a fourth order VCO-based sigma-delta ADC. The sensor readout circuit 511 may be implemented as a series of oscillator and phase referenced integrator (PRI) units. The first oscillator VCO1 510 receives a signal 502 from the sensor interface circuit and the first PRI1 512 receives a signal from the first VCO1 510. Each subsequent oscillator may be configured to receive a signal from the previous PRI. Each PRI may be configured to receive an input from its corresponding oscillator and an input from the feedback generator 518. The feedback generator 518 may be driven by a clock that corresponds to the sampling frequency. The sampling frequency may range from hundreds of kHz to a few MHz. Each oscillator-PRI unit represents an additional order in the sigma-delta ADC and is connected to the previous unit via a single-bit interconnection. The first oscillator VCO 510 may be configured to have low phase noise and medium-high sensitivity. It may be a ring oscillator. The second, third, and fourth oscillators 514a-c, may be DCOs having a high sensitivity. For example, each of these DCOs may be an IDAC coupled to a current-controlled relaxation oscillator. The PRIs 512, 516a-c may all be one-bit up-down counters. The PRIs, VCO, DCOs, and feedback generator may be similar to those described with respect to the various embodiments of a $2^{nd}$ order VCO-based ΣΔ ADC sensor readout circuit. They may have different delays, currents, and capacitances. This $4^{th}$ order VCO-based ΣΔ ADC sensor readout circuit may be adapted to be any Nth order VCO-based ΣΔ ADC sensor readout circuit by adding or removing a DCO-PRI unit, where N is an integer equal to or greater than 1.

In various embodiments, the VCO-based ΣΔ ADC sensor readout circuit may be modified into a current-controlled oscillator (CCO)-based ΣΔ ADC by replacing the VCO with a CCO. FIG. 2D illustrates a block diagram of various embodiments of a microphone biasing and amplification circuit coupled to a CCO-based ADC having single-bit interconnections in a single-ended converter configuration. Referring to FIG. 2D, an analog current signal i(t) provided from a sensor interface circuit drives the input of a current-controlled oscillator (CCO) 710. The CCO 710 is used as an initial integrator of a ΣΔ modulator. The signal i(t) modulates the frequency of the CCO 710 to generate a frequency modulated signal. The CCO 710 should be configured to have the combination of linearity, sensitivity (MHz/A), and low phase noise in order to be coupled to for example the biasing and amplification circuit 701. As shown in FIG. 2D, the biasing and amplification circuit 701 may include a MEMS microphone 703 coupled to a voltage biasing circuit 709 and a transconductance circuit 705. The transconductance circuit 705 may convert the high impedance voltage output of a MEMS sensor into an output current signal 702 for driving a CCO-based sensor readout circuit.

In various embodiments, a VCO/CCO-ΣΔ-based converter sensor readout circuit is provided that uses only single-bit connections between the oscillators and the PRIs with the purpose of keeping the circuit simple and reducing die area. It has great potential for low-cost digital microphones due to the lower amount of die area needed, when compared to an equivalent conventional A. Reduced ASIC size leads to low cost digital microphones for use in applications such as watches and other wearables. The reduced complexity leads to lower current consumption which improves battery life in mobile devices. The mostly digital design may eliminate charge pumps and high voltage components, which lowers system costs. The dynamic range and input levels of the VCO/CCO-ΣΔ-based converter are compatible with existing MEMS microphones, including both single backplate MEMS for single-ended configurations and dual backplate MEMS for differential configurations. It is also compatible with other types of sensors like resistive bridges and pressure sensors. The VCO/CCO-ΣΔ-based converter may be extended to higher orders and may not need operational amplifiers or highly linear circuits.

In the following, various aspects of this disclosure will be illustrated:

Example 1 is a circuit that includes a voltage biasing circuit coupled to a MEMS microphone sensor, the MEMS microphone sensor coupled to a driver circuit, and the driver circuit coupled to an oscillator-based ADC circuit.

In Example 2, the subject matter of Example 1 can optionally include that the oscillator-based digital ADC circuit includes an Nth order sigma-delta modulator, where N is an integer equal to or greater than 1.

In Example 3, the subject matter of any one of Examples 1 or 2 can optionally include that the oscillator-based ADC circuit includes a first oscillator configured to have low phase noise, the first oscillator selected from the group consisting of a voltage-controlled oscillator (VCO) and a current-controlled oscillator (CCO), a first phase referenced integrator of N phase referenced integrators, wherein a first input of the first phase referenced integrator is coupled to an output of the first oscillator, a digitally-controlled oscillator (DCO), wherein an input of the DCO is coupled to an output of the first phase referenced integrator, a second phase referenced integrator, wherein a first input of the second phase referenced integrator is coupled to an output of the DCO, and a feedback generator, wherein an input of the feedback generator is coupled to an output of an Nth phase referenced integrator and an output of the feedback generator is coupled to at least a second input of the first phase referenced integrator and a second input of the second phase referenced integrator, wherein each input-output coupling comprises a single bit connection and N is equal to or greater than 2.

In example 4, the subject matter of any one of Examples 1-3 can optionally include: a level shifter, wherein an input of the level shifter is coupled to an output of the first oscillator and the first input of the first phase referenced integrator is coupled to an output of the level shifter.

In example 5, the subject matter of any one of Examples 1-4 can optionally include that the VCO includes an M-stage ring oscillator, where M is an integer equal to or greater than 1.

In example 6, the subject matter of any one of Examples 1-5 can optionally include that the first phase referenced integrator includes a first flip-flop configured to be triggered by the output of the first oscillator and a second flip-flop configured to be triggered by the output of the feedback generator.

In example 7, the subject matter of any one of Examples 1-6 can optionally include that the first phase referenced integrator includes a one-bit counter configured to output a logic one on each rising edge of the output of the VCO and output a logic zero on each rising edge of the output of the feedback generator.

In example 8, the subject matter of any one of Examples 1-7 can optionally include that the DCO includes an oscillator configured to oscillate at a first frequency when the input of the DCO is a logic zero and oscillate at a second frequency when the input of the DCO is a logic one.

In example 9, the subject matter of any one of Examples 1-8 can optionally include that the DCO further includes a 1-bit current DAC coupled to the oscillator, wherein the oscillator is a current-controlled oscillator.

In example 10, the subject matter of any one of Examples 1-9 can optionally include that the feedback generator is configured to sample the output of the Nth phase referenced integrator and provide a feedback signal to at least the first and the second phase referenced integrators to decrease the values of the first and second phase referenced integrators.

In example 11, the subject matter of any one of Examples 1-10 can optionally include that the feedback generator includes a first flip-flop configured to generate an output bit stream by sampling the output of the Nth phase referenced integrator and a second flip-flop configured to generate a feedback pulse based on a delayed clock when the output of the Nth phase referenced integrator is a logic high.

Example 12 is an integrated circuit that includes a first oscillator configured to have low phase noise, the first oscillator selected from the group consisting of a voltage-controlled oscillator (VCO) and a current-controlled oscillator (CCO), a first phase referenced integrator of N phase referenced integrators, wherein a first input of the first phase referenced integrator is coupled to an output of the first oscillator, a digitally-controlled oscillator (DCO), wherein an input of the DCO is coupled to an output of the first phase referenced integrator, a second phase referenced integrator, wherein a first input of the second phase referenced integrator is coupled to an output of the DCO, and a feedback generator, wherein an input of the feedback generator is coupled to an output of an Nth phase referenced integrator and an output of the feedback generator is coupled to at least a second input of the first phase referenced integrator and a second input of the second phase referenced integrator, wherein each input-output coupling comprises a single-bit connection and where N is an integer equal to or greater than 2.

In example 13, the subject matter of Example 12 can optionally include a voltage biasing circuit and a driver circuit, wherein the voltage biasing circuit is coupled to the driver circuit and the driver circuit is coupled to the first oscillator.

In example 14, the subject matter of any one of Examples 12-13 can optionally include that the VCO includes an M-stage ring oscillator, where M is an integer equal to or greater than 1.

In example 15, the subject matter of any one of Examples 12-14 can optionally include that the first phase referenced integrator includes a first flip-flop configured to be triggered by the output of the first oscillator and a second flip-flop configured to be triggered by the output of the feedback generator.

In example 16, the subject matter of any one of Examples 12-15 can optionally include that the first phase referenced integrator includes a one-bit counter configured to output a logic one on each rising edge of the output of the first oscillator and output a logic zero on each rising edge of the output of the feedback generator.

In example 17, the subject matter of any one of Examples 12-16 can optionally include that the DCO includes an oscillator configured to oscillate at a first frequency when the input of the DCO is a logic zero and oscillate at a second frequency when the input of the DCO is a logic one.

In example 18, the subject matter of any one of Examples 12-17 can optionally include that the DCO further includes a 1-bit current DAC coupled to the oscillator, wherein the oscillator is a current-controlled oscillator.

In example 19, the subject matter of any one of Examples 12-18 can optionally include that the feedback generator is configured to sample the output of the Nth phase referenced integrator and provide a feedback signal to at least the first and the second phase referenced integrators to decrease values of the first and second phase referenced integrators.

In example 20, the subject matter of any one of Examples 12-19 can optionally include that the feedback generator includes a first flip-flop configured to generate an output bit stream by sampling the output of the Nth phase referenced integrator and a second flip-flop configured to generate a feedback pulse based on a delayed clock when the output of the Nth phase referenced integrator is a logic high.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, the scope of the invention is thus indicated by the appended claims and the equivalents thereof.

What is claimed is:

1. A circuit comprising:
   a voltage biasing circuit coupled to a microelectro-mechanical system (MEMS) microphone sensor;
   the MEMS microphone sensor coupled to a driver circuit; and
   the driver circuit coupled to an oscillator-based ADC circuit,
   wherein the oscillator-based ADC circuit comprises an Nth order sigma-delta modulator, where N is an integer equal to or greater than 1, and
   wherein the oscillator-based ADC circuit comprises:
   a first oscillator configured to have low phase noise, the first oscillator selected from the group consisting of a voltage-controlled oscillator (VCO) and a current-controlled oscillator (CCO);
   a first phase referenced integrator of N phase referenced integrators, wherein a first input of the first phase referenced integrator is coupled to an output of the first oscillator;
   a digitally-controlled oscillator (DCO), wherein an input of the DCO is coupled to an output of the first phase referenced integrator;
   a second phase referenced integrator, wherein a first input of the second phase referenced integrator is coupled to an output of the DCO; and
   a feedback generator, wherein an input of the feedback generator is coupled to an output of an Nth phase referenced integrator and an output of the feedback generator is coupled to at least a second input of the first phase referenced integrator and a second input of the second phase referenced integrator,
   wherein each of the input-output couplings comprises a single-bit connection and N is equal to or greater than 2.

2. The circuit of claim 1, further comprising:
   a level shifter, wherein an input of the level shifter is coupled to an output of the first oscillator; and
   the first input of the first phase referenced integrator is coupled to an output of the level shifter.

3. The circuit of claim 1, wherein the VCO comprises:
   an M-stage ring oscillator, where M is an integer equal to or greater than 1.

4. The circuit of claim 1, wherein the first phase referenced integrator comprises:
   a first flip-flop configured to be triggered by the output of the first oscillator; and
   a second flip-flop configured to be triggered by the output of the feedback generator.

5. The circuit of claim 1, wherein the first phase referenced integrator comprises:
   a one-bit counter configured to output a logic one on each rising edge of the output of the first oscillator and output a logic zero on each rising edge of the output of the feedback generator.

6. The circuit of claim 1, wherein the DCO comprises:
   an oscillator configured to oscillate at a first frequency when the input of the DCO is a logic zero and oscillate at a second frequency when the input of the DCO is a logic one.

7. The circuit of claim 6, wherein the DCO further comprises:
   a 1-bit current DAC coupled to the oscillator, wherein the oscillator is a current-controlled oscillator.

8. The circuit of claim 1, wherein
   the feedback generator is configured to sample the output of the Nth phase referenced integrator and provide a feedback signal to at least the first and the second phase referenced integrators to decrease the values of the first and second phase referenced integrators.

9. The circuit of claim 1, wherein the feedback generator comprises:
   a first flip-flop configured to generate an output bit stream by sampling the output of the Nth phase referenced integrator; and
   a second flip-flop configured to generate a feedback pulse based on a delayed clock when the output of the Nth phase referenced integrator is a logic high.

10. An integrated circuit comprising:
    a first oscillator configured to have low phase noise, the first oscillator selected from the group consisting of a voltage-controlled oscillator (VCO) and a current-controlled oscillator (CCO);
    a first phase referenced integrator of N phase referenced integrators, wherein a first input of the first phase referenced integrator is coupled to an output of the first oscillator;
    a digitally-controlled oscillator (DCO), wherein an input of the DCO is coupled to an output of the first phase referenced integrator;
    a second phase referenced integrator, wherein a first input of the second phase referenced integrator is coupled to an output of the DCO; and
    a feedback generator, wherein an input of the feedback generator is coupled to an output of an Nth phase referenced integrator and an output of the feedback generator is coupled to at least a second input of the first phase referenced integrator and a second input of the second phase referenced integrator,
    wherein each input-output coupling comprises a single-bit connection and where N is an integer equal to or greater than 2.

11. The integrated circuit of claim 10, further comprising:
    a voltage biasing circuit; and
    a driver circuit, wherein the voltage biasing circuit is coupled to the driver circuit and the driver circuit is coupled to the first oscillator.

12. The integrated circuit of claim 10, wherein the VCO comprises:
    an M-stage ring oscillator, where M is an integer equal to or greater than 1.

13. The integrated circuit of claim 10, wherein the first phase referenced integrator comprises:
   a first flip-flop configured to be triggered by the output of the first oscillator; and
   a second flip-flop configured to be triggered by the output of the feedback generator.

14. The integrated circuit of claim 10, wherein the first phase referenced integrator comprises a one-bit counter configured to output a logic one on each rising edge of the output of the first oscillator and output a logic zero on each rising edge of the output of the feedback generator.

15. The integrated circuit of claim 10, wherein the DCO comprises:
   an oscillator configured to oscillate at a first frequency when the input of the DCO is a logic zero and oscillate at a second frequency when the input of the DCO is a logic one.

16. The integrated circuit of claim 15, wherein the DCO further comprises:
   a 1-bit current DAC coupled to the oscillator, wherein the oscillator is a current-controlled oscillator.

17. The integrated circuit of claim 10, wherein
   the feedback generator is configured to sample the output of the Nth phase referenced integrator and provide a feedback signal to at least the first and the second phase referenced integrators to decrease values of the first and second phase referenced integrators.

18. The integrated circuit of claim 10, wherein the feedback generator comprises:
   a first flip-flop configured to generate an output bit stream by sampling the output of the Nth phase referenced integrator; and
   a second flip-flop configured to generate a feedback pulse based on a delayed clock when the output of the Nth phase referenced integrator is a logic high.

* * * * *